United States Patent
Reddy et al.

(10) Patent No.: US 7,385,383 B2
(45) Date of Patent: Jun. 10, 2008

(54) METHODS AND SYSTEMS FOR DETERMINING EFFICACY OF STRESS PROTECTION CIRCUITRY

(75) Inventors: Vijay Kumar Reddy, Plano, TX (US); Gianluca Boselli, Farmers Branch (IT); Jeremy Charles Smith, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 572 days.

(21) Appl. No.: 11/145,141

(22) Filed: Jun. 3, 2005

(65) Prior Publication Data

US 2006/0274473 A1 Dec. 7, 2006

(51) Int. Cl.
*G01R 19/00* (2006.01)
*G01R 27/28* (2006.01)
*G06F 17/50* (2006.01)

(52) U.S. Cl. .............. 324/76.11; 324/612; 703/15
(58) Field of Classification Search ............ 324/76.11, 324/612; 703/15
See application file for complete search history.

(56) References Cited

U.S. PATENT DOCUMENTS

| | | | | |
|---|---|---|---|---|
| 4,101,743 A | * | 7/1978 | Costes et al. ............ 324/158.1 |
| 5,978,197 A | * | 11/1999 | Chan ...................... 324/713 |
| 6,091,594 A | * | 7/2000 | Williamson et al. ........ 361/111 |
| 6,216,099 B1 | * | 4/2001 | Fang et al. ................ 703/15 |
| 6,933,731 B2 | * | 8/2005 | Reddy et al. .............. 324/612 |
| 7,205,854 B2 | * | 4/2007 | Liu ........................ 324/763 |
| 7,282,937 B2 | * | 10/2007 | Muniandy et al. .......... 324/763 |
| 7,298,161 B2 | * | 11/2007 | Bernstein et al. .......... 324/769 |
| 2003/0204820 A1 | * | 10/2003 | Asano et al. .............. 716/1 |
| 2004/0145384 A1 | * | 7/2004 | Bernstein et al. .......... 324/765 |
| 2005/0045952 A1 | * | 3/2005 | Chatty et al. .............. 438/197 |
| 2005/0085028 A1 | * | 4/2005 | Chatty et al. .............. 438/200 |
| 2005/0086038 A1 | | 4/2005 | Reddy et al. |

* cited by examiner

*Primary Examiner*—Andrew H Hirshfeld
*Assistant Examiner*—Timothy J. Dole
(74) *Attorney, Agent, or Firm*—Frederick J. Telecky, Jr.; Wade J. Brady, III

(57) ABSTRACT

Methods and systems are provided for determining efficacy of stress protection circuitry. The methods and systems employ a ring oscillator that models at least one parameter of a functional circuit to be protected by the stress protection circuit. A stress signal is applied to the ring oscillator and parametric degradation is measured to determine the effectiveness of the stress protection circuit in protecting the ring oscillator. A stress signal can be a voltage or current that stresses the normal operation of a functional circuit. The parametric degradation of the ring oscillator can be correlated to the parametric degradation that would be experienced by the functional circuit.

20 Claims, 3 Drawing Sheets

METHODS AND SYSTEMS FOR DETERMINING EFFICACY OF STRESS PROTECTION CIRCUITRY

TECHNICAL FIELD

The present invention relates generally to electrical circuits, and more particularly to methods and systems for determining efficacy of stress protection circuitry.

BACKGROUND

Integrated circuits (ICs) can be damaged by electrostatic discharge (ESD) events, in which large currents flow through the device. These ESD events often involve situations where an IC becomes charged and discharges to ground. Additionally, ESD events typically involve discharge of current between one or more pins or pads exposed to the outside of an IC chip. During an ESD event, current may flow through vulnerable circuitry in the IC that may not be designed to carry such currents. The vulnerability of IC chips to ESD events has created an important need for ESD protection circuits. As a result of the need to protect IC chips from ESD events, ESD protection circuits are often added to the integral design of IC chips to protect functional circuits (e.g., input devices, output devices) from ESD events.

ESD events are only one type of stress that may be experienced by a functional circuit. Other types of stress can include other forms of electrical overstress (EOS), overvoltage stress, overcurrent stress and latchup. Protection circuits for these types of stress are often added to the integral design of IC chips. The protection circuits are evaluated during testing to determine whether the protection circuitry protects the protected circuitry within a certain predetermined limit. However, present stress protection circuit development does not incorporate any mechanism or methodology to assess the efficacy of the protection circuit to prevent the protected circuit from subtle parametric degradation.

SUMMARY

In one aspect of the present invention, a method is provided for determining efficacy of stress protection circuitry. The method comprises selecting a ring oscillator to model a functional circuit, and fabricating stress protection circuitry to protect the functional circuit on an integrated circuit with the ring oscillator. The stress protection circuitry is configured to protect the ring oscillator from stress signals. A stress test is performed on the ring oscillator and parametric degradation of the ring oscillator from the stress test to parametric degradation of the functional circuit is correlated.

In another aspect of the present invention, another method is provided for determining efficacy of stress protection circuitry. The method comprises selecting a ring oscillator to model a functional circuit, designing stress protection circuitry to protect the functional circuit, and fabricating the stress protection circuitry and the ring oscillator on a test chip. The stress protection circuitry is configured to protect the ring oscillator from stress signals. The method further comprises performing a first measurement of at least one parameter of the ring oscillator, applying a stress signal to terminals of the ring oscillator for a predetermine time period, and performing a second measurement of the at least one parameter of the ring oscillator. The second measurement is compared to the first measurement to determine parametric degradation, and it is determined if the parametric degradation is within acceptable limits.

In yet another aspect of the present invention, a system is provided for determining efficacy of stress protection circuitry. The system comprises a ring oscillator that models at least one parameter of a functional circuit, stress protection circuitry designed to protect the functional circuit from stress signals. The stress protection circuit is configured to protect the ring oscillator from stress signals wherein both the ring oscillator and the stress protection circuit are fabricated on a test chip. A measurement system is provided that measures at least one parameter of the ring oscillator before and after a stress test is performed on the ring oscillator to determine the efficacy of the stress protection circuit.

DETAILED DESCRIPTION

Methods and systems are provided for determining efficacy of stress protection circuitry. The methods and systems employ a ring oscillator that models at least one parameter of a functional circuit to be protected by the stress protection circuit. A stress signal is applied to the ring oscillator and parametric degradation is measured to determine the effectiveness of the stress protection circuit in protecting the ring oscillator. A stress signal can be a voltage (e.g., an overvoltage, an electrostatic discharge (ESD) strike) or current (e.g., an overcurrent) that stresses the normal operation of a functional circuit. The parametric degradation of the ring oscillator can be correlated to the parametric degradation that would be experienced by the functional circuit.

Figure 1:
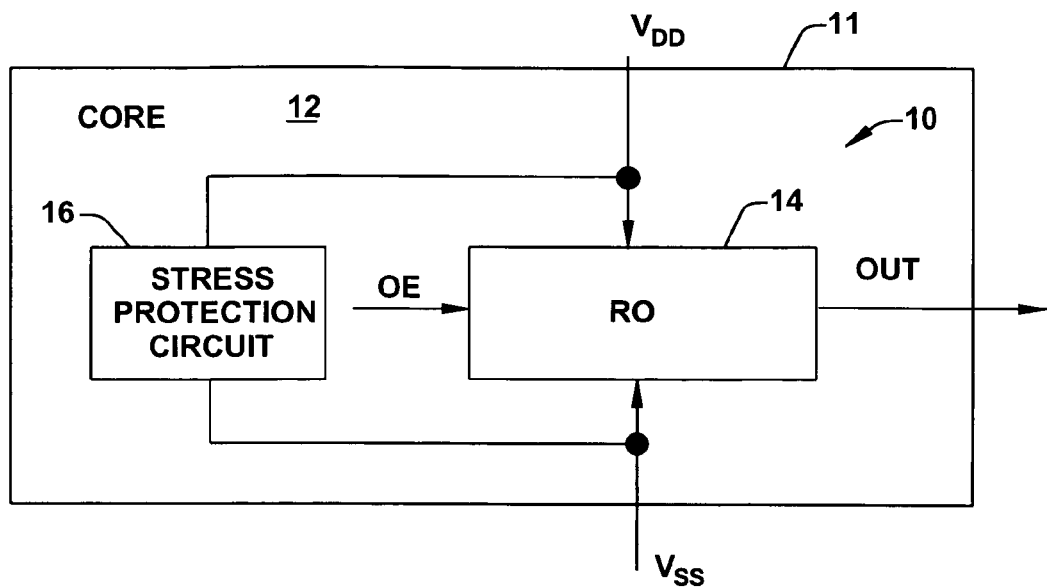
FIG. 1 illustrates a block diagram of a system for determining efficacy of stress protection circuitry in accordance with an aspect of the present invention.

FIG. 1 illustrates a system 10 for determining efficacy of a stress protection circuitry in accordance with an aspect of the present invention. The system 10 resides on a core 12 of an integrated circuit 11. The integrated circuit 11 can be a test chip employed to determine the effectiveness of the stress protection circuit for mitigating parametric degradation of a protected functional circuit. The system 10 includes a stress protection circuit 16 and a ring oscillator (RO) 14 that models at least one parameter of a functional circuit to be protected by the stress protection circuit 16. The stress protection circuit 16 can be an electrical overstress (EOS) protection circuit, an ESD protection circuit, an overvoltage protection circuit, an overcurrent protection circuit or a latch up protection circuit. In the exemplary system of FIG. 1, the stress protection circuit 16 and the RO 14 are coupled in parallel between a positive supply voltage rail ($V_{DD}$) and a negative supply voltage rail ($V_{SS}$), such that the stress protection circuit 16 provides an alternate current path for a stress condition across the positive supply voltage rail and the negative supply voltage rail of the RO 14. It is to be appreciated that one or more different stress protection circuit configurations could be employed, such as providing a stress protection circuit from the positive supply voltage rail and/or the negative supply voltage rail to an output of the RO 14, or one or more inputs and/or outputs of devices within the RO 14.

The RO 14 is formed from a plurality of series coupled delay elements (e.g., inverters). A feedback path (not shown) is provided from the output of the RO 14 to the input (not shown) of the RO 14 to cause the RO 14 to oscillate upon enablement of the RO 14 via an output enable (OE) signal. The delay elements are selected to model at least one parameter (e.g., quiescent current, minimum operating voltage, maximum operating frequency) associated with a given core circuit topology. Different types of ROs can be implemented to model different core circuit topologies (e.g., cascaded devices, mixed voltage device, high speed-low capacitance devices).

Prior to stress testing of the integrated circuit 11, at least one parameter of the RO 14 is measured. For example, a minimum voltage ($V_{MIN}$) that causes the RO 14 to oscillate can be determined. A minimum quiescent current ($I_{DDQ}$) of the RO 14 when the RO 14 is disabled can be determined. A maximum operating frequency ($F_{MAX}$) at nominal voltage can also be determined. A stress test is performed on the integrated circuit by applying, for example, a stress voltage (e.g., ESD strike, overvoltage) across terminals of the RO 14 for a predetermined time period. A number of times a stress voltage is applied across the terminals, or across different terminals can be based on an associated stress test type and/or an associated functional circuit implementation.

After applying of the stress voltage one or more times across the terminals or across different terminals, the same parameters of the RO 14 are measured. The measured parameters before applying stress and after applying stress are compared to determine if any parametric degradation has occurred. For example, an increase in quiescent current ($I_{DDQ}$) indicates gate oxide damage to one or more transistors in the RO 14, which could result in oxide damage to one or more transistors in the protected functional circuit. A decrease in the maximum operating frequency ($F_{MAX}$), or an increase in the minimum voltage ($V_{MIN}$) indicates damage to one or more transistor interfaces in the RO 14, which could result in damage to one or more transistor interfaces in the protected functional circuit. It can then be determined if the parametric degradation is acceptable or unacceptable. If the parametric degradation is unacceptable, a redesign of the stress protection circuit 16 is in order.

Figure 2:
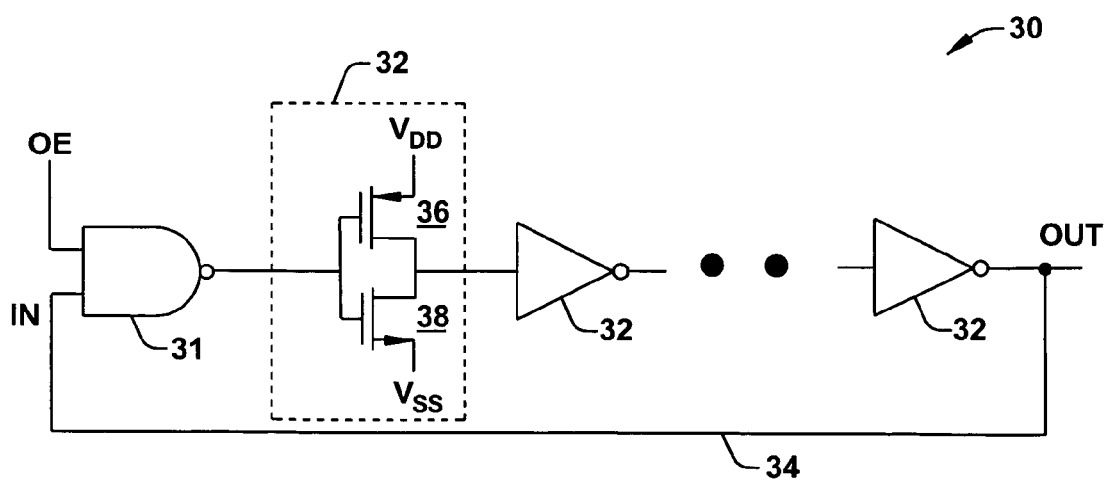
FIG. 2 illustrates an exemplary ring oscillator in accordance with an aspect of the present invention.

FIG. 2 illustrates an exemplary RO 30 in accordance with an aspect of the present invention. The RO includes a plurality of series coupled inverters 32 that provide an associated delay. One inverter 32 is illustrated in detail showing the transistors that form the inverter 32. As illustrated, each inverter 32 includes a PMOS transistor 36 and an NMOS transistor 38 connected in series. The drain of the PMOS 36 transistor is connected to a positive supply voltage rail ($V_{DD}$) and the source of the NMOS transistor 38 is connected to a negative supply voltage rail ($V_{SS}$). The gates of the transistors 36 and 38 are coupled and controlled by an output of the preceding delay device. A NAND gate 31 is provided as a first device that receives an output enable (OE) signal and an input signal. A feedback path 34 is provided from the output of the RO 30 to the input of the RO 30 to cause the RO 30 to oscillate, when the OE signal activates the NAND gate 31. The NAND gate 31 and inverters 32 of the RO 30 can be selected to model the parameters of a stress protected functional circuit. Stress protection circuitry can be fabricated to protect the RO 30 from stress, and stress tests can be performed on the RO 30 to determine parametric degradation of the RO 32 in response to stress testing. The parametric degradation can be employed to correlate the efficacy of the stress protection circuitry on the actual functional circuit, which the RO 30 models.

Figure 3:
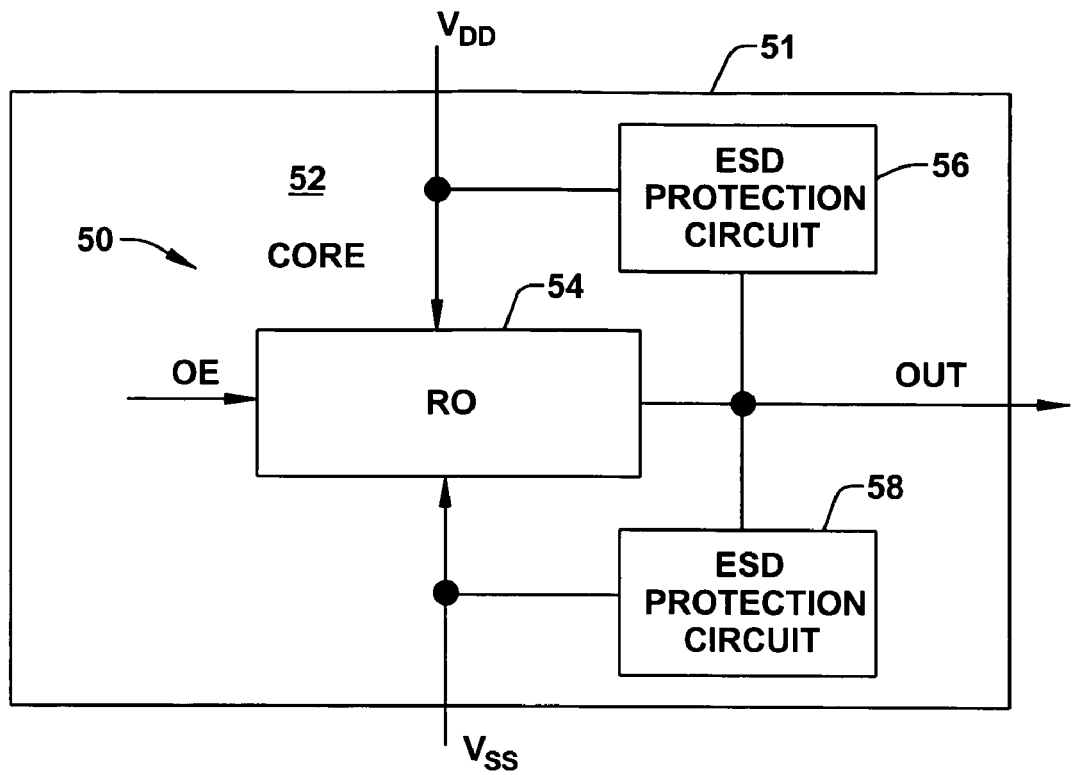
FIG. 3 illustrates a block diagram of a system for determining efficacy of electrostatic discharge (ESD) circuitry in accordance with an aspect of the present invention.

FIG. 3 illustrates a system 50 for determining efficacy of one or more ESD protection circuits in accordance with an aspect of the present invention. The system 50 resides on a core of an integrated circuit 51. The integrated circuit 51 can be a test chip employed to determine the effectiveness of the stress protection circuit for mitigating parametric degradation of a protected functional circuit. The system 50 includes a RO 54 that models at least one parameter of a functional circuit to be protected by the ESD protection circuits. The system 50 includes a first ESD protection circuit 56 coupled between a positive supply voltage rail ($V_{DD}$) of the RO 54 and an output terminal of the RO 54, and a second ESD protection circuit 58 coupled between the output terminal of the RO 54 and a negative supply voltage rail ($V_{SS}$) of the RO 54, such that the first and second ESD protection circuits 56 and 58 provide alternate current paths for an ESD strike across terminals of the RO 54.

It is to be appreciated that one or more different ESD protection circuit configurations could be employed, such as providing a ESD protection circuit from the positive supply voltage rail and/or the negative supply voltage rail to one or more inputs and/or outputs of devices within the RO 54.

Prior to ESD testing of the integrated circuit 51, at least one parameter of the RO 54 is measured. For example, at least one of a minimum voltage, a minimum quiescent current of the RO 54 when the RO 54 is disabled, and a maximum operating frequency at nominal voltage can be determined. An ESD test is performed on the integrated circuit 51 by applying, for example, an ESD strike across terminals of the RO 54 for a predetermined time period. For example, an ESD strike can be applied across the positive supply voltage rail and the negative supply voltage rail, the positive supply voltage rail and the output terminal and/or the output terminal and the negative supply voltage rail. A number of times an ESD strike is applied across the terminals, or across different terminals can be based on a functional circuit implementation.

After applying of the ESD strikes one or more times across the terminals or across different terminals, the same parameters of the RO 54 are measured. The measured parameters before applying stress and after applying stress are compared to determine if any parametric degradation has occurred. For example, an increase in quiescent current ($I_{DDQ}$) indicates gate oxide damage to one or more transistors in the RO 54, which could result in oxide damage to one or more transistors in the protected functional circuit. A decrease in the maximum operating frequency ($F_{MAX}$), or an increase in the minimum voltage ($V_{MIN}$) indicates damage to one or more transistor interfaces in the RO 54, which could result in damage to one or more transistor interfaces in the protected functional circuit. It can then be determined if the parametric degradation is acceptable or unacceptable. If the parametric degradation is unacceptable, a redesign of the ESD protection circuits 56 and 58 is in order.

Figure 4:
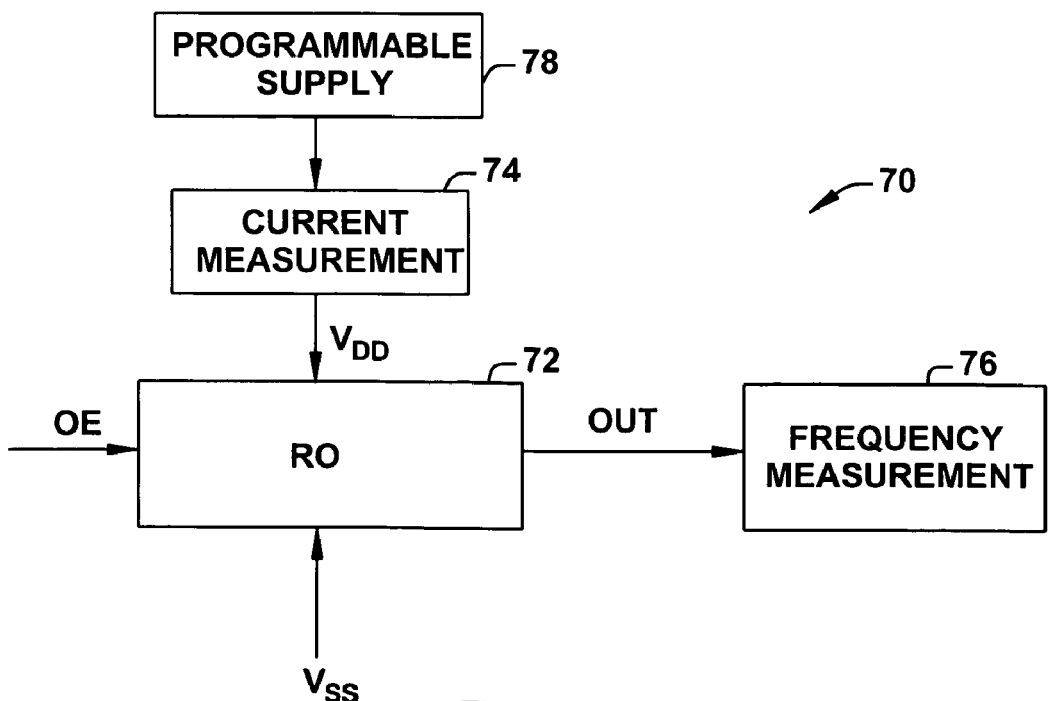
FIG. 4 illustrates an exemplary measurement system for measuring parameters associated with a ring oscillator in accordance with an aspect of the present invention.

FIG. 4 illustrates an exemplary measurement system 70 for measuring parameters associated with an RO 72 in accordance with an aspect of the present invention. The exemplary measurement system 70 includes a current measurement device 74 coupled between a programmable positive voltage supply 78 and a positive voltage supply rail ($V_{DD}$) of the RO 72. The current measurement device 74 can be a current meter that provides a quiescent current reading of the RO 72 when the RO 72 is disabled via an output enable (OE) signal. Alternatively, the current measurement device 74 can be coupled between a negative voltage supply (not shown) and a negative voltage supply rail ($V_{SS}$) of the RO 72. An increase in quiescent current ($I_{DDQ}$) indicates gate oxide damage to one or more transistors in the RO 72, which could result in oxide damage to one or more transistors in the protected functional circuit.

The measurement system 70 also includes a frequency measurement device 76 coupled to an output of the RO 72. The frequency measurement device 76 can be, for example, a counter that counts a number of output pulses of the RO 76 over a predetermined period of time. The count of the counter can be correlated to a frequency output of the RO 72. A decrease in the maximum operating frequency ($F_{MAX}$) indicates damage to one or more transistor interfaces in the RO 72, which could result in damage to one or more transistor interfaces in the protected functional circuit. The measurement system 70 also includes the programmable power supply 78. The programmable power supply 78 can be programmed to reduce the supply voltage to the RO 72 and the frequency measurement device 76 can be employed to determine a minimum operating voltage in which the RO 72 oscillates. An increase in the minimum voltage ($V_{MIN}$) indicates damage to one or more transistor interfaces in the RO 72, which could result in damage to one or more transistor interfaces in the protected functional circuit.

Figure 5:
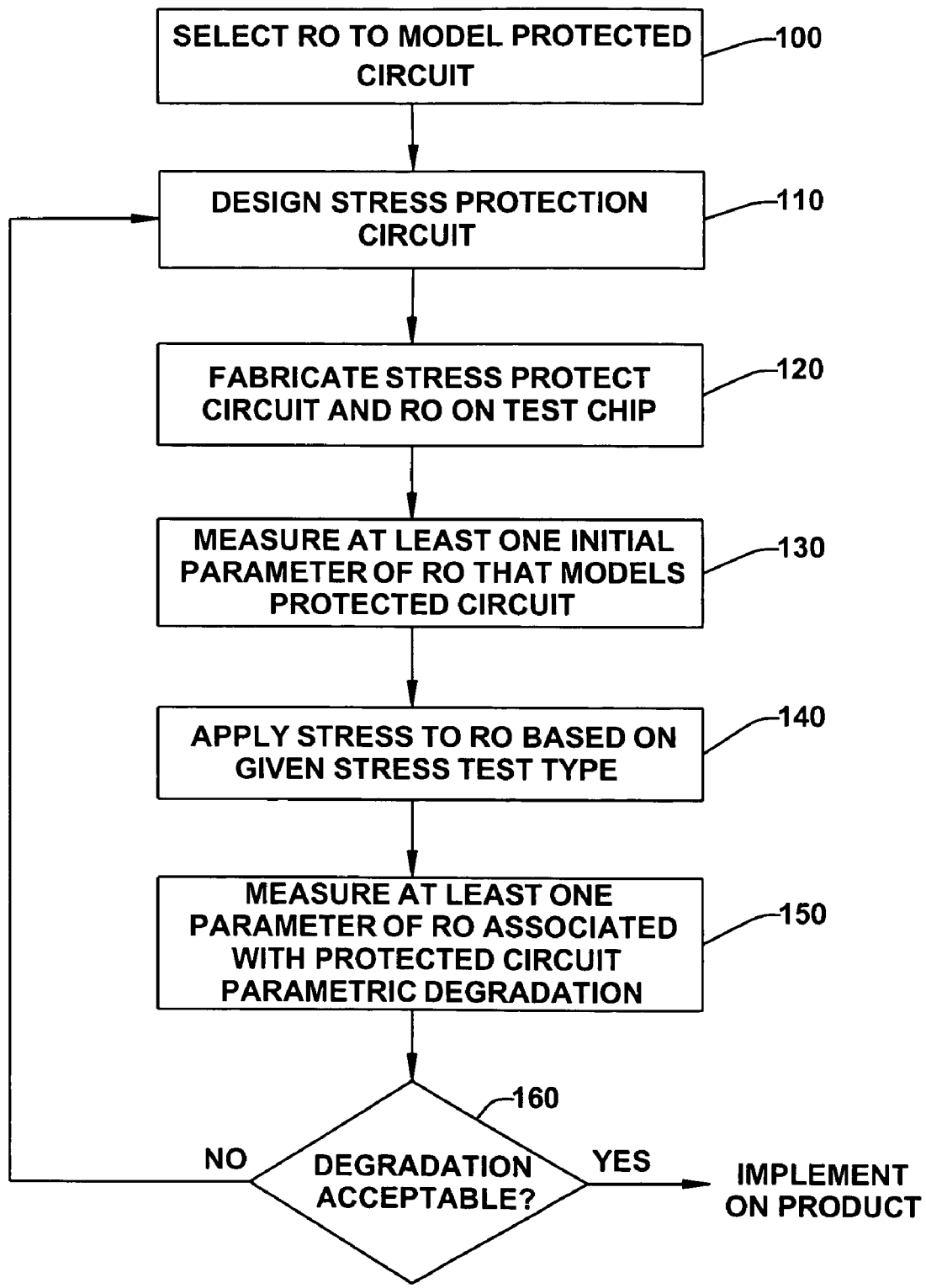
FIG. 5 illustrates a methodology for determining efficacy of stress protection circuitry in accordance with an aspect of the present invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 illustrates a methodology for determining efficacy of stress protection circuitry in accordance with an aspect of the present invention. At 100, an RO is selected to model a protected functional circuit. The RO can include delay elements that are selected to model at least one parameter (e.g., quiescent current, minimum voltage, maximum operating frequency) associated with a given core circuit topology. Different types of ROs can be implemented to model different core circuit topologies (e.g., cascaded devices, mixed voltage devices, high speed-low capacitance devices). At 110, one or more stress protection circuits are designed to protect the modeled protected functional circuit from stress. At 120, the stress protection circuitry and RO are fabricated onto a test chip, such that the stress protection circuitry is configured to protect the RO from stress similar to that experienced by the protected functional circuit. The methodology then proceeds to 130.

At 130, at least one initial parameter of the RO is measured that models the protected circuit. For example, a minimum voltage that causes the RO to oscillate can be determined. A minimum quiescent current of the RO when the RO is disabled can be determined. A maximum operating frequency at nominal voltage can also be determined. At 140, a stress signal is applied to the RO based on a given stress protection circuit type. For example, if the stress protection circuit is an ESD protection circuit, one or more ESD strikes are applied across terminals of the RO for one or more different terminal configurations. If the stress protection circuit is an overvoltage protection circuit and overvoltage stress is applied across an output terminal and the negative supply voltage rail. The methodology then proceeds to 150.

At 150, at least one parameter of the RO associated with the protected circuit is measured to determine parametric degradation. The methodology then proceeds to 160. At 160, the method determines if the parametric degradation is acceptable. The parametric degradation can be determined by comparing the initial measured parameters of the RO to the measured parameters of the RO after the applied stress. If the parametric degradation is acceptable (YES), the stress protection circuit is implemented on the product. If the parametric degradation is not acceptable (NO), the methodology returns to 110 to redesign the stress protection circuit.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for determining efficacy of stress protection circuitry, the method comprising:
    selecting a ring oscillator to model a functional circuit;
    fabricating stress protection circuitry to protect the functional circuit on an integrated circuit with the ring oscillator, the stress protection circuitry configured to protect the ring oscillator from stress signals;
    performing a stress test on the ring oscillator; and
    correlating parametric degradation of the ring oscillator from the stress test to parametric degradation of the functional circuit.

2. The method of claim 1, wherein performing a stress test comprises applying a stress signal across at least one set of terminals of the ring oscillator for a predetermined time period.

3. The method of claim 2, wherein the stress signal is one of an electrostatic discharge (ESD) strike, an overvoltage signal, an overcurrent signal and a latchup signal.

4. The method of claim 1, further comprising measuring at least one parameter of the ring oscillator prior to performing a stress test and measuring the at least one parameter of the ring oscillator after performing the stress test to determine parametric degradation of the ring oscillator from the stress test.

5. The method of claim 4, wherein the at least one parameter comprises at least one of quiescent current, minimum operating voltage and maximum output frequency of the ring oscillator.

6. The method of claim 5, further comprising determining if an increase in quiescent current indicates gate oxide damage of at least one transistor in the ring oscillator and one of an increase in minimum supply voltage and a decrease in maximum operating frequency indicates damage to at least one transistor interface in the ring oscillator.

7. The method of claim 1, further comprising determining if parametric degradation of the ring oscillator is within acceptable limits and redesigning the protection circuitry if the parametric degradation is not within acceptable limits.

8. The method of claim 1, wherein the ring oscillator is selected to model one of cascaded devices, mixed voltage devices, and high speed-low capacitance devices.

9. The method of claim 1, wherein performing a stress test comprises performing one of an electrostatic discharge (ESD) test, an overvoltage test, an overcurrent test and a latch up test.

10. A method for determining efficacy of stress protection circuitry, the method comprising:
    selecting a ring oscillator to model a functional circuit;
    designing stress protection circuitry to protect the functional circuit;
    fabricating the stress protection circuitry and the ring oscillator on a test chip, such that the stress protection circuitry is configured to protect the ring oscillator from stress signals;
    performing a first measurement of at least one parameter of the ring oscillator;
    applying a stress signal to at least one set of terminals of the ring oscillator for a predetermine time period;
    performing a second measurement of the at least one parameter of the ring oscillator;
    comparing the second measurement to the first measurement to determine parametric degradation of the ring oscillator; and
    determining if the parametric degradation is within acceptable limits.

11. The method of claim 10, wherein the stress signal is one of an electrostatic discharge (ESD) strike, an overvoltage signal, an overcurrent signal and a latchup signal.

12. The method of claim 10, wherein the at least one parameter comprises at least one of quiescent current, minimum operating voltage and maximum output frequency of the ring oscillator.

13. The method of claim 10, further comprising correlating parametric degradation of the ring oscillator with the functional circuit and redesigning the protection circuitry if the parametric degradation is not within acceptable limits.

14. The method of claim 10, wherein the ring oscillator is selected to model one of cascaded devices, mixed voltage device, and high speed-low capacitance devices.

15. A system for determining efficacy of stress protection circuitry, the system comprising:
    a ring oscillator that models at least one parameter of a functional circuit;
    stress protection circuitry designed to protect the functional circuit from stress signals, the stress protection circuit configured to protect the ring oscillator from stress signals wherein both the ring oscillator and the stress protection circuit are fabricated on a test chip; and
    a measurement system programmed to measure at least one parameter of the ring oscillator before and after a stress test is performed on the ring oscillator and programmed to determine the efficacy of the stress protection circuit.

16. The system of claim 15, wherein stress protection circuitry operates to protect the functional circuit and the ring oscillator due to a stress signal during one of an electrostatic discharge (ESD) strike, an overvoltage signal, an overcurrent signal and a latchup signal.

17. The system of claim 15, wherein the at least one parameter comprises at least one of quiescent current, minimum operating voltage and maximum output frequency of the ring oscillator.

18. The system of claim 17, wherein the measurement system comprises a current measurement device for measuring quiescent current of the ring oscillator.

19. The system of claim 17, wherein the measurement system comprises a frequency measurement device for measuring operating frequency of the ring oscillator.

20. The system of claim 19, wherein the measurement system comprises a programmable supply for reducing the voltage to the ring oscillator, the frequency measurement device and the programmable supply cooperating to determine the minimum operating voltage of the ring oscillator.

* * * * *